(12) United States Patent
Margomenos et al.

(10) Patent No.: US 7,824,997 B2
(45) Date of Patent: Nov. 2, 2010

(54) MEMBRANE SUSPENDED MEMS STRUCTURES

(75) Inventors: Alexandros Margomenos, Ann Arbor, MI (US); Linda P. B. Katehi, Zionsville, IN (US); Yuxing Tang, Ann Arbor, MI (US)

(73) Assignee: EMAG Technologies, Inc., Ann Arbor, MI (US)

( * ) Notice: Subject to any disclaimer, the term of this patent is extended or adjusted under 35 U.S.C. 154(b) by 215 days.

(21) Appl. No.: 12/056,780

(22) Filed: Mar. 27, 2008

(65) Prior Publication Data

US 2009/0246929 A1    Oct. 1, 2009

(51) Int. Cl.
*H01L 21/20* (2006.01)
(52) U.S. Cl. .................. 438/379; 438/48; 438/53; 438/57; 438/763; 257/414; 257/595; 257/E21.35
(58) Field of Classification Search .............. None
See application file for complete search history.

(56) References Cited

U.S. PATENT DOCUMENTS

| 6,857,501 B1 * | 2/2005 | Han et al. ............ 181/158 |
| 2005/0226281 A1 * | 10/2005 | Faraone et al. .......... 372/20 |
| 2006/0065916 A1 * | 3/2006 | Zhang et al. ............ 257/295 |

FOREIGN PATENT DOCUMENTS

KR    1020050029884    *    3/2005

OTHER PUBLICATIONS

Peroulis et al, Electrostatically-Tunable Analog RF MEMS Varactors with Measured Capacitance Range of 300%, pp. 1793-1796, Microwave Symposium Digest, 2003 IEEE MTT-S International, Publication Date: Jun. 8-13, 2003.*

* cited by examiner

*Primary Examiner*—Thanh V Pham
*Assistant Examiner*—Andres Munoz
(74) *Attorney, Agent, or Firm*—John A. Miller; Miller IP Group, PLC

(57)    ABSTRACT

A method for micro-machining a varactor that is part of a membrane suspended MEMS tunable filter. In one non-limiting embodiment, the method includes providing a main substrate; depositing a membrane on the main substrate; depositing and patterning a plurality of sacrificial photoresist layers at predetermined times during the fabrication of the varactor; depositing metal layers that define a fabricated varactor structure enclosed within photoresist; coupling a carrier substrate to the fabricated structure opposite to the main substrate using a release layer; etching a central portion of the main substrate to expose the membrane; removing the carrier substrate by dissolving the release layer in a material that attacks the release layer but does not dissolve the photoresist; and removing the photoresist layers to provide a released varactor.

9 Claims, 6 Drawing Sheets

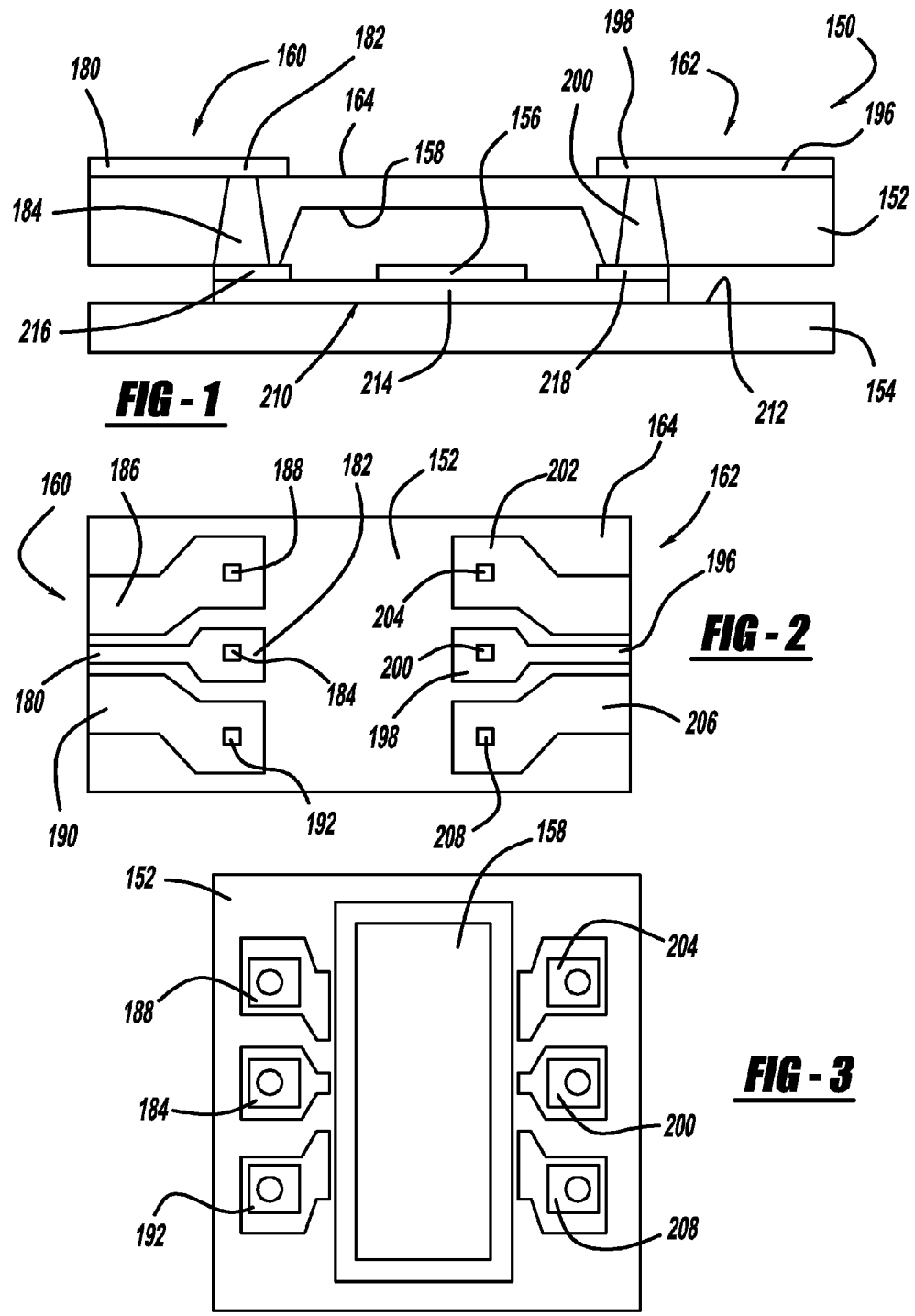

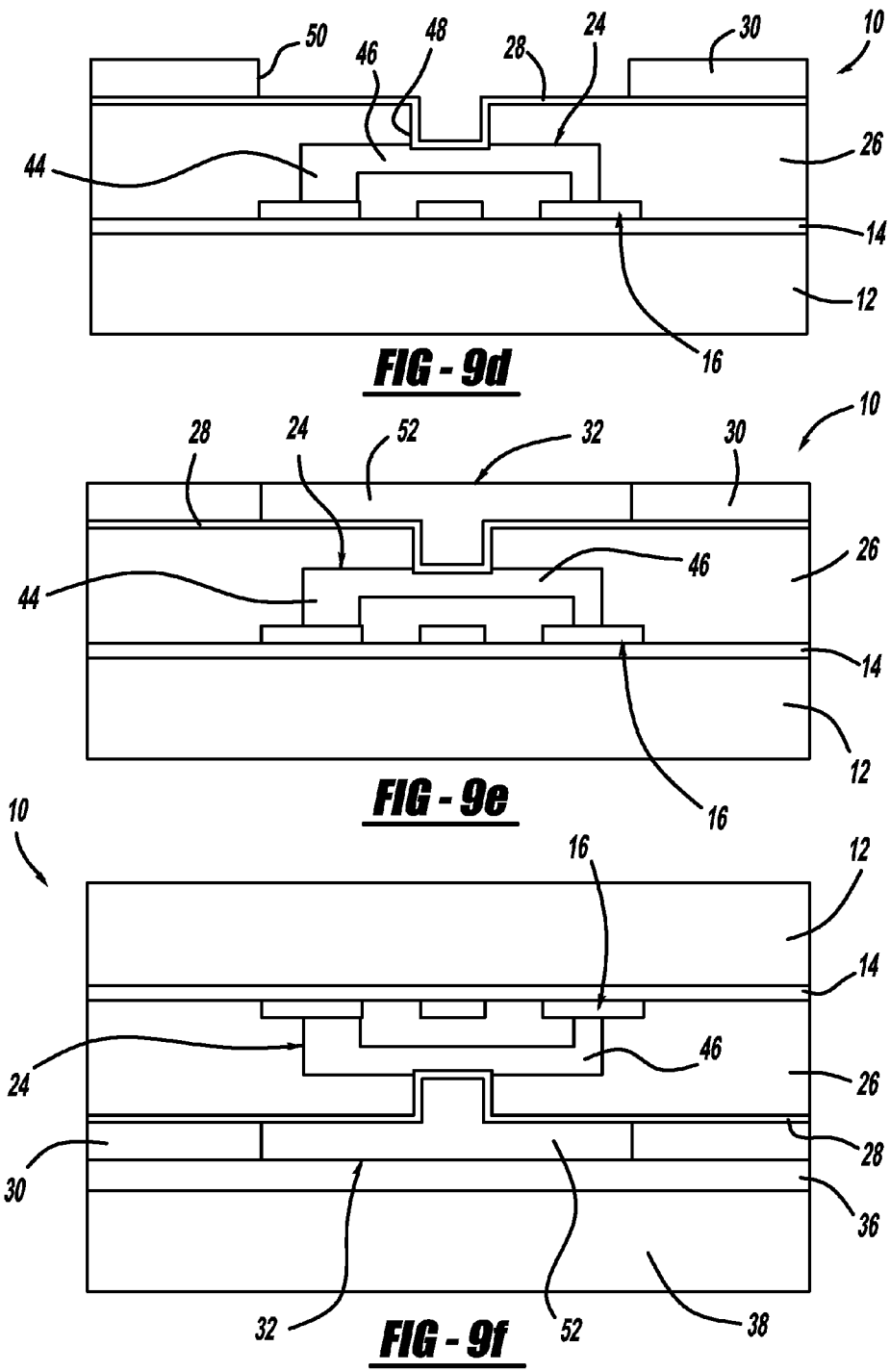

MEMBRANE SUSPENDED MEMS STRUCTURES

BACKGROUND OF THE INVENTION

1. Field of the Invention

This invention relates generally to a method for fabricating a varactor suspended over a suspended membrane and, more particularly, a method for micro-machining a varactor filter including a varactor suspended over a suspended membrane on a semiconductor substrate.

2. Discussion of the Related Art

While communications systems and radar are advancing to higher frequencies of operation, there is a clear need to allow propagation of multiple channels in relatively narrow frequency bands. This can be accomplished by large waveguide filter banks. However, such filter banks are difficult to deploy in space and are not ideal for error or ground based operations. What would help advance high frequency applications are affordable, tunable filters that allow for operation over a wide frequency bandwidth. Silicon micro-machining is an ideal approach for developing tunable filters for high frequency applications by combining high-Q resonant structures with mature RF micro-electromechanical switches (MEMS) varactor technologies.

Due to low-loss characteristics, micro-machined transmission line resonators provide an excellent method to realize high-Q filters. The microstrip line can be suspended on a thin dielectric membrane that consists of 3000/4000 Å of $SiO_2$/$Si_xN_y$ layers deposited on a thermally grown 7000 Å $SiO_2$ layer. This membrane can be formed by completely etching silicon after patterning the microstrip conductor. Cavities are formed on top and bottom silicon wafers and are metallized. These metallized cavities provide microstrip ground planes and shields when the three wafers are assembled together. The complete elimination of the substrate reduces the effective permittivity ($\epsilon_{eff}$) nearly to that of air ($\epsilon_r=1$), therefore minimizing the dielectric loss and enabling the high-Q characteristics. The resonator discussed herein can be fabricated by deep reactive ion etching (DRIE) processes that allow precise control of the shape and size of the etched structures. The RF performance of the resonator depends on the geometric characteristics of the etched structures, and therefore avoiding the shortcomings of wet anisotropic etching, undercutting of convex corners, pyramidal shape of etched structures, etc. is advantageous.

Important parameters for designing such a microstrip resonator include that the conductor width and the ground plane distance have a direct effect on the characteristic impedance $Z_0$ of the line and the quality factor Qu of the resonator, provided that the shield height and the side wall distances are large enough. First, for the resonator to be loaded with MEMs varactors, the conductor width can be 600 μm. Then, to minimize their effects, the shield height can be 920 μm, and the sidewall distance from the center can be 1.8 mn. The quality factor $Q_u$ can be calculated as $$Q_u = \frac{\pi}{\lambda_g x} = \frac{\beta}{2\alpha}$$

where, $\gamma=\alpha+j\beta$ is the complex propagation constant and $\lambda_g$ is the guided wavelength.

In most cases, numerical analysis tools over-estimate the quality factor Q. This is due to various factors that cannot be modeled accurately in numerical simulations. For example, surface roughness of the metal layers in cavity walls has an important factor on the overall loss, but is not considered in the simulations.

One design challenge in transitioning a co-planar waveguide (CPW) to a microstrip line is the transition of the ground plane to a different layer. For the case of a resonator, this transition occurs with the use of two rectangular metallized posts. The formation of a rectangular post inside a silicon cavity has an intrinsic difficulty because the post is a combination of four convex corners. A convex corner is defined as the corner bounded by the fastest etching crystal planes in the silicon. The etching of rectangular convex corners in anisotropic etching solutions by KOH or TMAH leads to a deformation of the edges due to cornering undercutting. It is clear that by using wet anisotropic etching it is very difficult to control the shape and size of the final etched structure. However, a DRIE process allows control of the etched structures at an expense of the surface roughness. By utilizing DRIE in contrast to anisotropic etching, very accurate membrane suspended filters can be fabricated whose measured response very closely matches the theoretical expectations.

SUMMARY OF THE INVENTION

In accordance with the teachings of the present invention, a method for micro-machining a varactor that is part of a membrane suspended MEMS tunable filter is disclosed. In one non-limiting embodiment, the method includes providing a main substrate; depositing a membrane on the main substrate; depositing and patterning a first sacrificial photoresist layer on the membrane; depositing a first metal seed layer on the patterned first photoresist layer; depositing and patterning a second sacrificial photoresist layer on the first metal seed layer to expose a central portion of the seed layer; depositing a first varactor beam on the first metal seed layer within the central portion of the second photoresist layer; removing at least a portion of the first photoresist layer, second photoresist layer and the first metal seed layer; depositing and patterning a third sacrificial photoresist layer over the first varactor beam and the membrane so as to expose a central portion of the first varactor beam; depositing a second metal seed layer over the third photoresist layer and the exposed portion of the first varactor beam; depositing and patterning a fourth sacrificial photoresist layer over the second metal seed layer so as to expose a central portion of a second metal seed layer; depositing a second varactor beam on the second metal seed layer so that the second varactor beam has a T-shape that is electrically coupled to the second seed layer and the first varactor beam; coupling a carrier substrate to the fourth photoresist layer and the second varactor beam opposite to the main substrate using a release layer; depositing and patterning a masking layer on the main substrate; etching a central portion of the main substrate to expose the membrane; removing the carrier substrate by using a material that attacks the release layer but does not attack the photoresist material; and removing any remaining portions of the first, third and fourth photoresist layers to provide a released varactor.

Additional features of the present invention will become apparent from the following description and appended claims, taken in conjunction with the accompanying drawings.

BRIEF DESCRIPTION OF THE DRAWINGS

FIG. 1 is a cross-sectional view of a top-via transition between a top wafer and a substrate wafer, according to an embodiment of the present invention;

FIG. 2 is a top view of the top wafer shown in FIG. 1;

FIG. 3 is a bottom view of the top wafer shown in FIG. 1;

FIGS. 9(a)-9(i) are cross-sectional views of a structure for fabricating a membrane suspended MEMS tunable varactor filter, according to an embodiment of the present invention.

DETAILED DESCRIPTION OF THE EMBODIMENTS

The following discussion of the embodiments of the invention directed to a method for micro-machining a varactor filter including a varactor suspended over a suspended membrane on a semiconductor substrate is merely exemplary in nature and is in no way intended to limit the invention or its applications or uses.

Figure 4:
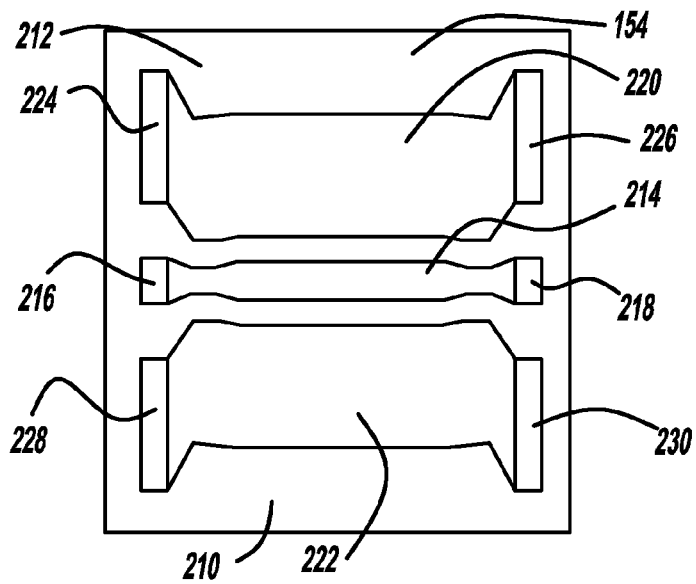
FIG. 4 is a top view of the substrate wafer shown in FIG. 1.

FIG. 1 is a cross-sectional view of a vertically integrated wafer package 150 including a top wafer 152 and a substrate wafer 154 showing a top-via transition. In one non-limiting embodiment, the top wafer 152 is a silicon wafer that is about 100 µm thick and the substrate wafer 154 is a silicon, GaAs, InP, GaN, etc. substrate wafer. The package 150 provides a hermetically sealed package for an RF device 156, such as a cavity filter, MEMS, etc., positioned within a cavity 158 formed through a bottom surface of the wafer 152, as shown. FIG. 2 is a top view of the wafer 152, FIG. 3 is a bottom view of the wafer 152 and FIG. 4 is a top view of the substrate wafer 154.

A short finite input co-planar waveguide (CPW) 160 and a short finite output CPW 162 are formed on a top surface 164 of the top wafer 152. The input CPW 160 includes a signal line 180 having a flared and widened portion 182 electrically coupled to a signal via 184 extending through the wafer 152. The input CPW 160 also includes a first input ground plane 186 electrically coupled to a ground via 188 extending through the wafer 152 and electrically separated from the signal line 180. The input CPW 160 also includes a second input ground plane 190 electrically coupled to a ground via 192 extending through the wafer 152 and electrically separated from the signal line 180 opposite to the first input ground plane 186. Likewise, the output CPW 162 includes a signal line 196 having a flared and widened portion 198 electrically coupled to a signal via 200 extending through the wafer 152. The output CPW 162 also includes a first output ground plane 202 electrically coupled to a ground via 204 extending through the wafer 152, and a second output ground plane 206 electrically coupled to a ground via 208 extending through the wafer 152, where both the ground planes 202 and 206 are electrically separated from the signal line 196 on opposite sides thereof.

A transition CPW 210 is formed on a top surface 212 of the substrate wafer 154. The CPW 210 includes a signal line 214 having a metallized transition 216 at one end and a metallized transition 218 at an opposite end. In one non-limiting embodiment, the transitions 216 and 218 are gold (Au) bumps. The CPW 210 also includes a first transition ground plane 220 and a second transition ground plane 222 on opposite sides of the signal line 214, and electrically separated therefrom. The ground plane 220 includes a metallized transition 224 at one end and a metallized transition 226 at an opposite end. Likewise, the ground plane 222 includes a metallized transition 228 at one end and a metallized transition 230 at an opposite end. The transition 216 is electrically coupled to the signal via 184 and the transition 218 is electrically coupled to the signal via 200 so that the signal is transferred from the input CPW 160 to the transition CPW 210 and the RF device 156, and from the RF device 156 to the output CPW 162. The transition 224 is electrically coupled to the ground via 192, the transition 226 is electrically coupled to the ground via 208, the transition 228 is electrically coupled to the ground via 188 and the transition 230 is electrically coupled to the ground via 204.

The design of the top-via transition shown in FIGS. 1-4 requires a multi-phase process that involves both full wave simulation tools and a circuit simulator. There are five cascaded discontinuities that form the overall top-via transition. In order to assure optimum RF performance, any reflections from mismatches between these cascaded sections need to be eliminated. Therefore, each section is theoretically analyzed separately and is designed to have a 50Ω impedance.

The cascaded discontinuities include the CPW 160 on the top wafer 152 and the vias 184, 188, 192, 200, 204 and 208. A third discontinuity is provided by the CPW 210. A fourth discontinuity is the metallized transitions 216, 218, 224, 226, 228 and 230. In one non-limiting embodiment, the transitions 216, 218, 224, 226, 228 and 230 are 1 µm of Cr/Au deposited on opposite sides of the wafer 152 and 154 to form the coplanar waveguide interconnects. Subsequently, 3 µm of Au is electroplated on both sides in order to form the transitions 216, 218, 224, 226, 228 and 230. This creates bumps with 8 µm thickness sandwiched between the wafers 152 and 154, therefore changing the capacitance, dielectric constant and characteristic impedance of the connections. Using a two-dimensional electrostatic simulation tool, the line geometry is modified in order to preserve the original 50Ω characteristic impedance. The CPW 210 within the cavity 158 is similar to a free-space coplanar waveguide because the micromachined cavity 158 is designed in such a way as to have no effect on the characteristic impedance of the CPW.

Figure 5:
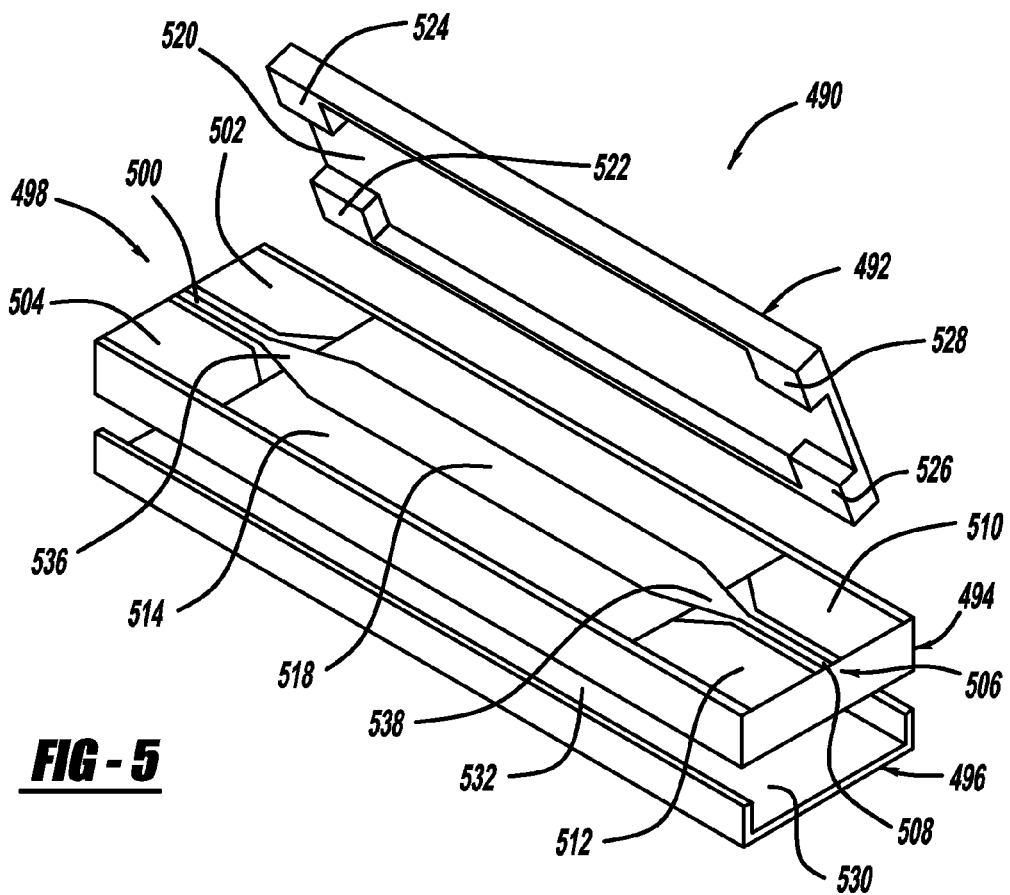
FIG. 5 is a perspective view of a filter employing a microstrip line on a membrane, according to another embodiment of the present invention.

FIG. 5 is a perspective view showing this type of a filter 490, according to another embodiment of the present invention. The filter 490 includes a ground plane wafer 492, a membrane wafer 494 and a shield wafer 496, where the wafers 492, 494 and 496 are silicon. A short finite input CPW 498 is provided at one end of the membrane wafer 494 and includes a signal line 500 and opposing ground planes 502 and 504 formed on a top surface of the wafer 494. A short finite output CPW 506 is provided at an opposite end of the membrane wafer 494 and includes a signal line 508 and opposing ground planes 510 and 512.

Figure 6:
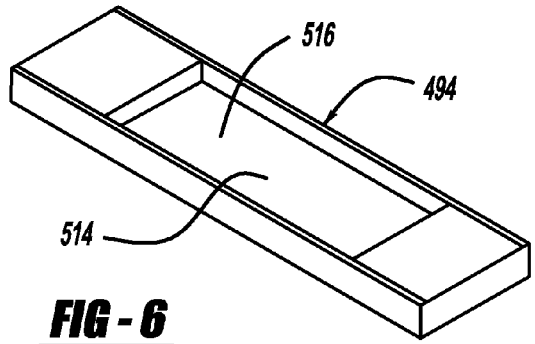
FIG. 6 is a bottom view of a membrane substrate of the filter shown in FIG. 5.

A membrane 514 is formed to the membrane wafer 494 and portions of the membrane wafer 494 are removed so that the membrane 514 is free to resonate. FIG. 6 is a bottom view of the membrane wafer 494 showing a cavity 516 formed by removing silicon from the wafer 494 so that the membrane 514 is able to resonate. A microstrip line 518 is formed on the membrane 514 and is electrically coupled to the signal lines 500 and 508.

The ground plane wafer 492 includes a ground plane 520 formed to bottom surface of the wafer 492 and provides the ground plane for the microstrip line 518. Metallized posts are formed to the ground plane 520 and include a post 522 that makes electrical contact with the ground plane 502, a post 524 that makes electrical contact with the ground plane 504, a post 526 that makes electrical contact with the ground plane 510 and a post 528 that makes electrical contact with the ground plane 512.

The shield wafer 496 includes a cavity 530 and a metallized shield layer 532. The cavity 530 combines with the cavity 516 within the membrane wafer 494 to allow the membrane 514 to resonate.

Figure 7:
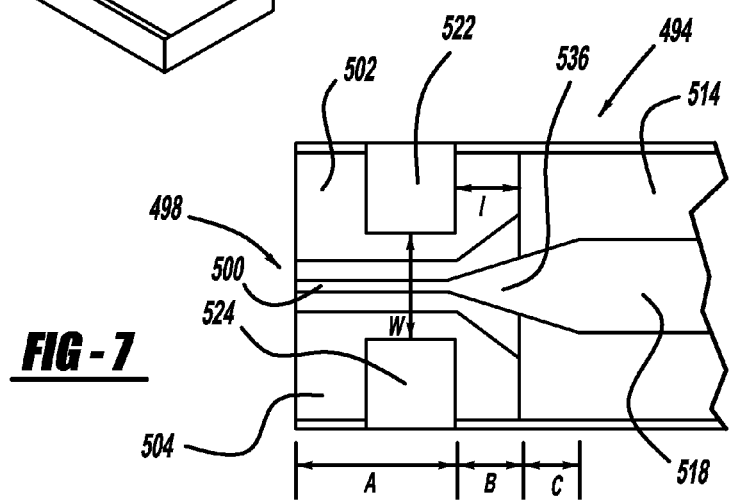
FIG. 7 is a top view of one end of the membrane substrate of the filter shown in FIG. 5.

The microstrip line 518 includes a transition 536 and a transition 538 that transitions to the signal lines 500 and 508, respectively, to provide impedance matching, such as 50Ω. FIG. 7 is a top view of one end of the membrane wafer 494 at an end thereof that includes the input CPW 498. The posts 522 and 524 are shown relative to the ground planes 502 and 504. FIG. 7 also shows sections A, B and C, and dimensions w and l, which will be described below.

The transition 536 occurs by a short section of low impedance CPW on silicon (section B) followed by a short section of high impedance microstrip on membrane (section C). The widths of the CPW signal line 500 and the microstrip line 518 are tapered to allow a smooth transition and to minimize the loss due to an abrupt discontinuity between the signal lines of the two 50Ω lines. The posts 522 and 524 allow the CPW ground planes 502 and 504 to transition to the microstrip ground plane that can be 250 μm from the microstrip line 518. The 50ΩCPW (section A) has a conductor/gap dimension of 80/100 μm, and the 50Ωmicrostrip line 518 has a conductor width of about 1150 μm. The height of the microstrip shield, which is the thickness of the membrane wafer 494 plus the depth of the cavity 530 in the shield wafer 496 can be 925 μm.

The performance of such a transition depends on a number of conditions. These conditions include the length of the tapered transmission line sections (sections B and C) as well as the location of the via contacts (l) and the width (w) of the opening between them. The two dimensions l and w control the series inductance between the two 50Ω lines 500 and 518, which increases as l and/or w increase. This series inductance created by the inductive loop formed by the CPW ground planes 502 and 504, the metallized posts 522 and 524 and the microstrip ground can be varied between 70-160 pH. Therefore, the transition performance can be controlled by changing l and w, thus providing the main reason why the DRIE process provides clear advantages over anisotropic etching.

The fabrication process for realizing the transition can be provided as follows. For the ground plane wafer 492, alignment keys are formed on the backside, 275 μm of silicon is DRIE etched in the parts where probing windows will be formed, and on the backside, by a second DRIE etch, 250 μm of silicon is etched. This etch forms the ground planes for the membrane suspended microstrip lines, the post contacts for the ground plane transitions, and the probing windows. Finally, the ground planes and the via contacts are metallized with 2 μm of sputtered gold.

For the membrane wafer 494, 3000/4000 Å of LPCBD $SiO_2/Si_xN_y$ layers are deposited on top of the 7000 Å $SiO_2$ layers on both sides. Alignment keys are formed on the backside. Circuit metallization is formed with 1 μm of gold using a standard lift-off process. Next, the wafer 494 is etched from the backside down to the thermal $SiO_2$ layer to release the membrane 514. The final process step is thermal compression bonding of the two wafers.

Figure 8:
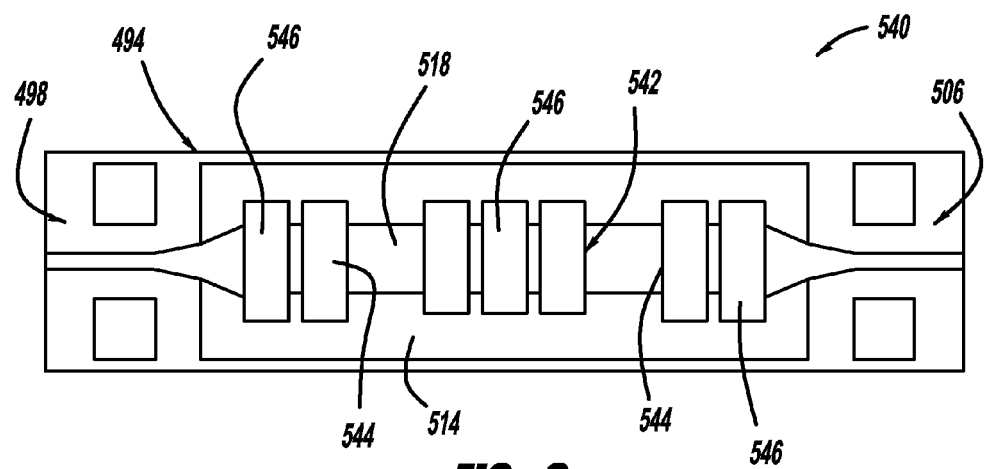
FIG. 8 is a top view of a membrane suspended MEMS tunable filter, according to an embodiment of the present invention.

FIG. 8 is a top view of a membrane suspended MEMS tunable filter 540 that includes the membrane wafer 494, where the ground plane wafer 492 has been removed and the shield wafer 496 is not shown, and where common elements to the filter 490 are identified by the same reference numeral. The filter 540 includes a plurality of RF MEMS varactors 542 attached to the microstrip line 518 and suspended over the membrane 514. The varactors 542 include main tuning varactors 544 for tuning the resonator frequency of the filter 540 and fine tuning varactors 546 for tuning the inter-resonator coupling between the varactors 542.

The RF MEMS varactors proposed herein are based on conventional RF MEMS fixed-fixed beam varactors suspended 2-3 μm over a printed transmission line. The fabrication process of the invention for the varactors 542 allows the formation of membrane suspended MEMS structures. The main motivation is that by removing the silicon substrate, or any other type of suitable substrate, under the CPW or microstrip interconnect, the loss is reduced. This result in a low-loss, high-Q structure for various devices, such as filters, phase shifters, etc. However, combining the substrate etching process, which creates the suspended membrane, with RF MEM switches is a challenging problem. The reason behind this is that in all conventional MEMs fabrication processes, a sacrificial layer, such as a photoresist or polyimide, is used to create the MEMS air bridges. This sacrificial layer needs to be removed, typically by a solvent, and subsequently the MEMS are released following a critical point dying. However, the nature of the sacrificial layer imposes significant restrictions on any post processing on the MEMS devices prior to their release.

The present invention proposes a technique that allows the wafer with non-released MEMS to be mounted on a carrier wafer, and then providing DRIE etching of the MEMS wafer. The outcome of this process is the fabrication and operation of MEMS devices on a released membrane wafer, although this technique can be used for multiple wafer thinning approaches.

FIGS. 9(a)-9(i) illustrate a series of fabrication steps for a membrane suspended tunable filter structure 10 that has application for fabricating the varactors 542, according to an embodiment of the present invention. The structure 10 includes a silicon substrate 12 on which has been deposited a membrane 14, such as the membrane 514, by a suitable process well known to those skilled in the art. In one non-limiting embodiment, the membrane 14 includes three layers, particularly a silicon oxide layer ($SiO_2$), a silicon nitride layer ($Si_3N_4$) and a silicon oxide layer ($SiO_2$). A co-planar waveguide (CPW) 16, such as the CPW 498, is deposited on the membrane 14.

Figure 9A:
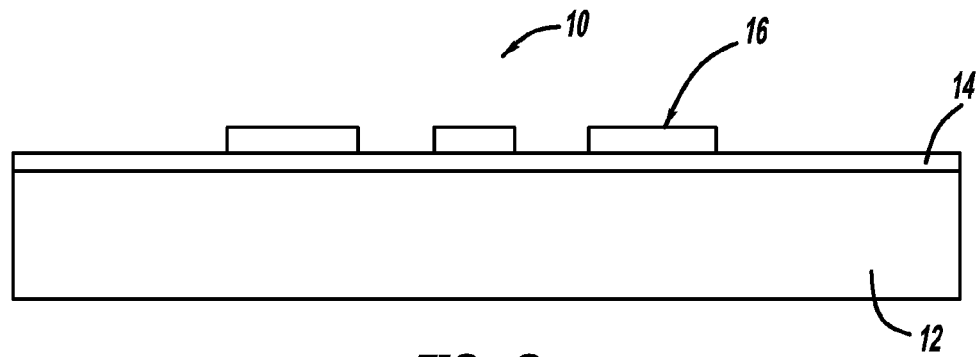
Figure 9B:
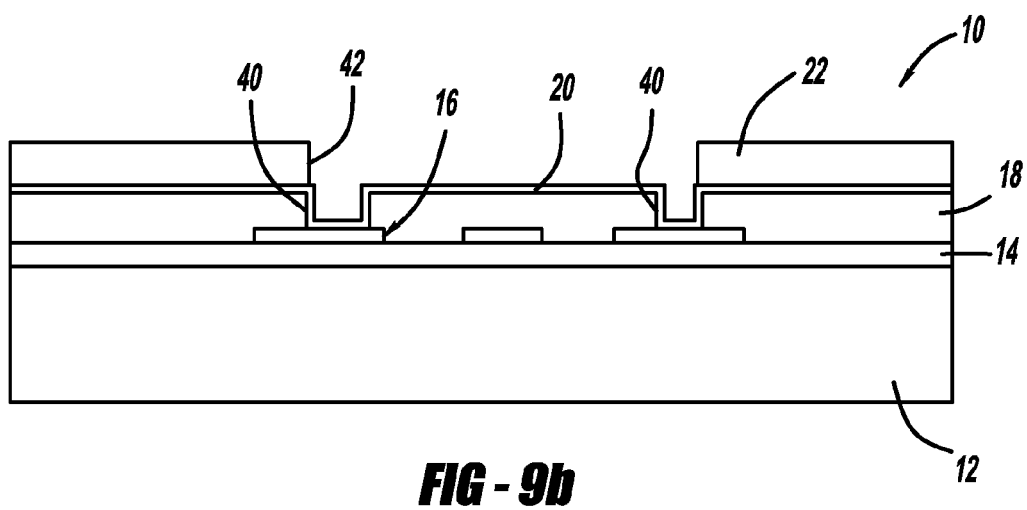
Figure 9C:
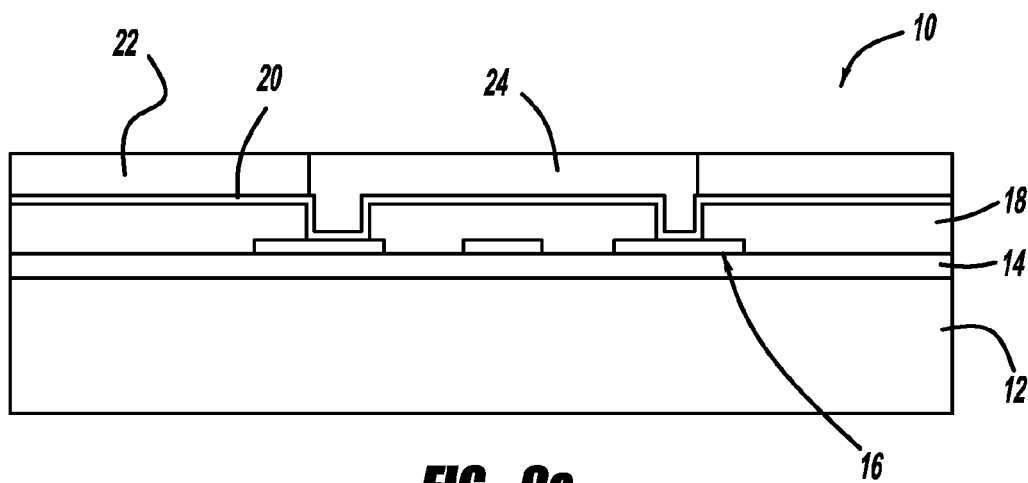

In FIG. 9(b), a sacrificial photoresist layer 18 has been deposited and etched on the membrane 14 and the CPW 16 to provide openings 40 in the photoresist layer 18 that expose the CPW 16, as shown. A nickel seed layer 20 is deposited on the etched photoresist layer 18 to provide a layer that accepts electroplating. Nickel is being used herein for the varactor. However, as will be appreciated by those skilled in the art, other metals may be equally applicable. Another sacrificial photoresist layer 22 is then deposited and patterned on the seed layer 20 to provide a central opening 42, as shown. Once the photoresist layer 22 is patterned, an electroplated nickel layer 24 is deposited on the nickel seed layer 20 within the opening 42 of the photoresist layer 22 so that legs 44 of the nickel layer 24 are electrically coupled to the CPW 16, and a lower varactor beam 46 is provided above the microstrip line of the CPW 16, as shown in FIG. 9(c).

The photoresist layer 22, the nickel seed layer 20 outside of the electroplated nickel layer 24 and the photoresist layer 18 of the lower beam 46 is removed by a suitable etching process. Another sacrificial photoresist layer 26 is then deposited over the structure 10, and is patterned to expose a central portion of the electroplated nickel layer 24 through an opening 48, as shown in FIG. 9(d). Another nickel seed layer 28 is then deposited on the patterned photoresist layer 26, and another sacrificial photoresist layer 30 is deposited and patterned on the nickel seed layer 28 to provide a central opening 50, as shown in FIG. 9(d). Another electroplated nickel layer 32 is deposited within the openings 48 and 50 on the nickel seed layer 28 to provide an upper varactor beam 52 of the varactor, as shown in FIG. 9(e).

Figure 9G:
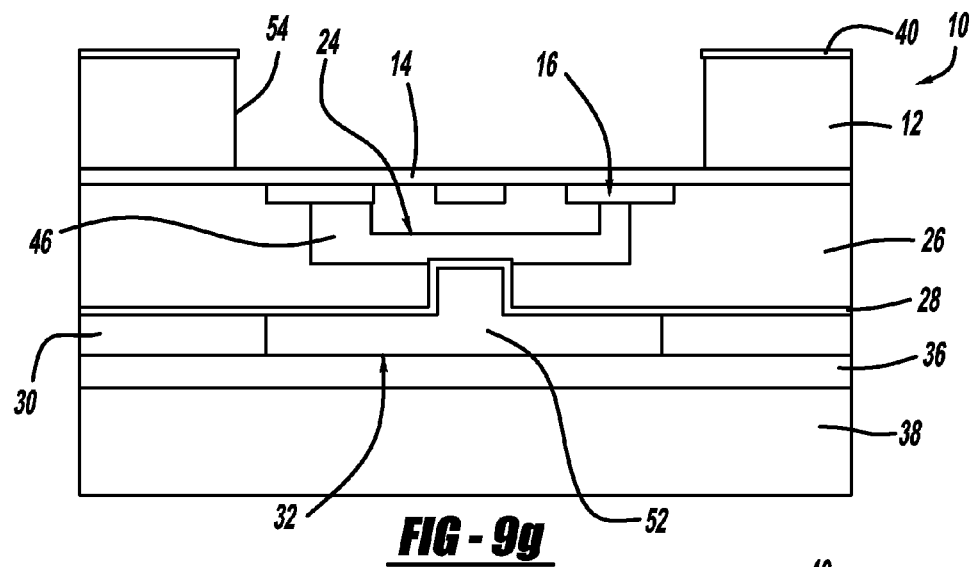
Figure 9H:
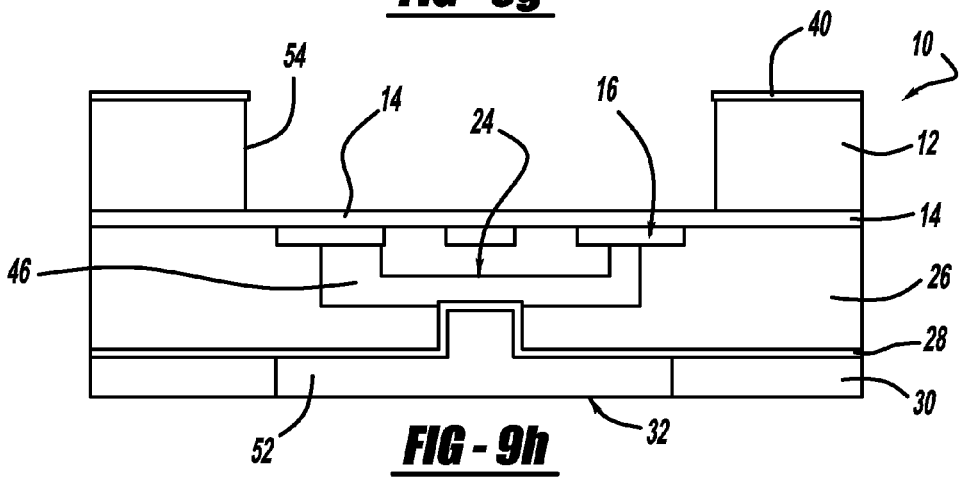
Figure 9I:
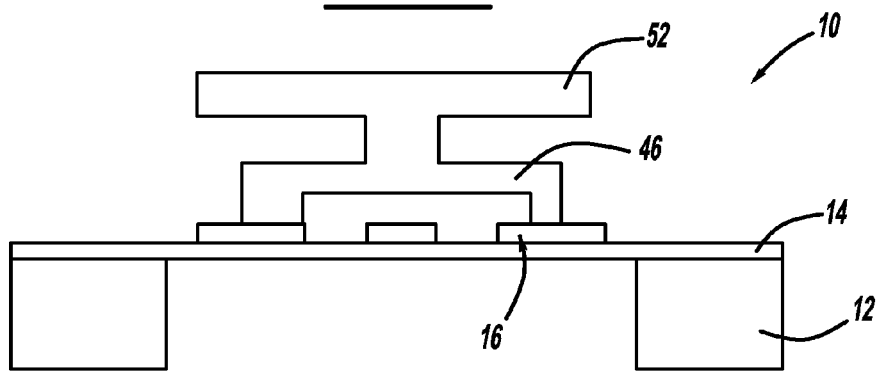

A layer of a release material 36, such as AIT Cool Grease 7016, is deposited on the electroplated upper beam 52 and the photoresist layer 30, and a carrier substrate 38 is attached to the release layer 36, as shown in FIG. 9(f). The structure 10 is then flipped over and a masking layer 40 is deposited and patterned to form an opening 54 relative to the substrate 12. The substrate 12 is selectively etched by a DRIE process through the opening 54 to expose the membrane 14, as shown in FIG. 9(g). The carrier wafer 38 is detached from the structure 10 by using a suitable material, such as isopropyl alcohol (IPA), that attacks the release layer 36, but does not attack the photoresist layers 26 and 30 so that the varactor made up of the lower beam 46 and the upper beam 52 are protected during the carrier substrate release process by the photoresist. The varactor is released by removing the photoresist layers 26 and 30 in a solvent bath that dissolves the photoresist, and subsequent critical point drying.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A method for fabricating a suspended varactor, said method comprising;

providing a main substrate;

depositing a membrane on the main substrate;

depositing and patterning a first sacrificial photoresist layer on the membrane;

depositing a first metal seed layer on the patterned first photoresist layer;

depositing and patterning a second sacrificial photoresist layer on the first metal seed layer to expose a central portion of the seed layer;

depositing a first varactor beam on the central portion of the first metal seed layer within an opening in the second photoresist layer;

removing at least a portion of the first photoresist layer, the second photoresist layer and the first metal seed layer;

depositing and patterning a third sacrificial photoresist layer over the first varactor beam and the membrane to expose a central portion of the first varactor beam;

depositing a second metal seed layer over the third photoresist layer and the exposed portion of the first varactor beam;

depositing and patterning a fourth sacrificial photoresist layer over the second metal seed layer to expose a central portion of the second metal seed layer;

depositing a second varactor beam on the second metal seed layer so that the second varactor beam has a T-shape that is electrically coupled to the second seed layer and the first varactor beam;

coupling a carrier substrate to the fourth photoresist layer and the second varactor beam opposite to the main substrate;

depositing and patterning a masking layer on the main substrate;

etching a central portion of the main substrate to expose the membrane;

removing the carrier substrate; and removing any remaining portion of the first, third and fourth photoresist layers to provide a released varactor.

2. The method according to claim 1 wherein coupling a carrier substrate to the fourth photoresist layer and the second varactor beam includes coupling the carrier substrate using a release layer.

3. The method according to claim 2 wherein removing the carrier substrate includes dissolving the release layer with a material that attacks the release layer but does not attack the photoresist layers.

4. The method according to claim 3 wherein the material is isopropyl alcohol.

5. The method according to claim 1 further comprising depositing a co-planar waveguide on the membrane prior to the first varactor bar being deposited on the membrane.

6. The method according to claim 1 wherein providing a main substrate includes providing a silicon substrate.

7. The method according to claim 1 wherein the first and second seed layers are nickel seed layers and the first and second varactor beams are nickel varactor beams that are electroplated onto the seed layers.

8. The method according to claim 1 wherein the membrane includes two silicon oxide layers with a silicon nitride layer therebetween.

9. The method according to claim 1 wherein the varactor is part of a membrane suspended MEMS tunable filter.

* * * * *